United States Patent
Lin et al.

(10) Patent No.: US 9,837,455 B2
(45) Date of Patent: Dec. 5, 2017

(54) IMAGE SENSOR

(71) Applicant: VisEra Technologies Company Limited, Hsin-Chu (TW)

(72) Inventors: Chung-Hao Lin, Keelung (TW); Wu-Cheng Kuo, Hsin-Chu (TW); Kuo-Feng Lin, Kaohsiung (TW); Yu-Kun Hsiao, Hsin-Chu (TW)

(73) Assignee: Visera Technologies Company Limited, Hsin-Chu (TW)

( * ) Notice: Subject to any disclaimer, the term of this patent is extended or adjusted under 35 U.S.C. 154(b) by 0 days.

(21) Appl. No.: 15/001,924

(22) Filed: Jan. 20, 2016

(65) Prior Publication Data
US 2017/0207258 A1 Jul. 20, 2017

(51) Int. Cl.
*H01L 27/146* (2006.01)

(52) U.S. Cl.
CPC .... *H01L 27/1462* (2013.01); *H01L 27/14621* (2013.01); *H01L 27/14627* (2013.01); *H01L 27/14629* (2013.01); *H01L 27/14645* (2013.01)

(58) Field of Classification Search
CPC ......... H01L 27/14627; H01L 27/14629; H01L 27/14625; H01L 27/14621; H01L 27/14685; G02B 5/1842; G02B 5/201; G02B 2006/12107; G01J 3/18; G01J 3/1804
USPC .......... 257/432, E31.127, E27.131, E25.032, 257/E27.132, E27.134; 250/208.1, 208.2; 438/70; 356/328; 359/566, 568, 570
See application file for complete search history.

(56) References Cited

U.S. PATENT DOCUMENTS

| | | | |
|---|---|---|---|
| 6,524,772 B1* | 2/2003 | Huang | G02B 5/1814 216/26 |
| 2002/0135825 A1* | 9/2002 | Lee | G02B 5/1814 358/509 |
| 2003/0063204 A1* | 4/2003 | Suda | H01L 27/14603 348/272 |
| 2009/0286346 A1 | 11/2009 | Adkisson et al. | |
| 2010/0165464 A1* | 7/2010 | Lin | G02B 3/0037 359/570 |
| 2010/0309554 A1* | 12/2010 | Nagai | G02B 5/1814 359/568 |
| 2011/0250715 A1 | 10/2011 | Adkisson et al. | |

FOREIGN PATENT DOCUMENTS

| | | |
|---|---|---|
| JP | 2010-239003 A | 10/2010 |
| JP | 2010-263228 A | 11/2010 |
| JP | 2012-227476 A | 11/2012 |

(Continued)

OTHER PUBLICATIONS

Taiwanese Office Action dated Jan. 25, 2017 from corresponding Application No. 105111021; 4 pages.

(Continued)

*Primary Examiner* — Jonathan Han
(74) *Attorney, Agent, or Firm* — Muncy, Geissler, Olds & Lowe, P.C.

(57) ABSTRACT

An image sensor includes a sensing layer, filter units, and a grid structure. The filter units are disposed on the sensing layer. The grid structure is disposed on the filter units, and includes grating portions. The grating portions form a number of grating groups, and each of the grating groups is separated from each other.

17 Claims, 5 Drawing Sheets

(56) References Cited

FOREIGN PATENT DOCUMENTS

| JP | 2015-68853 A | 4/2015 |
| JP | 2015-92521 A | 5/2015 |
| KR | 2011-0014986 A | 2/2011 |
| TW | 201103127 A | 1/2011 |
| WO | WO-2005/109042 A1 | 11/2005 |
| WO | WO-2009/140099 A2 | 11/2009 |

OTHER PUBLICATIONS

Office Action of corresponding JP application No. 2016-108491 dated Feb. 28, 2017 with English language translation (25 pgs.).
Office Action dated Aug. 1, 2017 in corresponding JP application No. 2016-108491 with its English translation (11 pages).

\* cited by examiner

IMAGE SENSOR

BACKGROUND OF THE INVENTION

Field of the Invention

The present disclosure relates to an image sensor, and in particular to an image sensor having grating structure on the filter unit.

Description of the Related Art

In general, a digital camera utilizes an image sensor to sense light and generate an image signal, and thus a picture taken by the digital camera can be generated according to the image signal.

As digital cameras continue to develop, high-quality image signals are increasingly required. The image sensors using a backside illumination (BSI) technology have light pipe structures to guide light to photodiodes. The image sensors have greater photosensitivity and image quality.

Although image sensors have been generally adequate for their intended purposes, they have not been entirely satisfactory in all respects. Consequently, it is desirable to provide a solution for improving image sensors.

BRIEF SUMMARY OF THE INVENTION

The present disclosure provides image sensors for improving the quality of image signals generated by the image sensors.

The present disclosure provides an image sensor including a sensing layer, filter units, and a grid structure. The filter units are disposed on the sensing layer. The grid structure is disposed on the filter units, and includes grating portions. The grating portions form a number of grating groups, and each of the grating groups is separated from each other.

In some embodiments, each of the grating groups includes at least 25 grating portions.

In some embodiments, the image sensor further includes a grid structure, disposed on the sensing layer, surrounding each of the filter units. Each of the grating groups is aligned to one of the filter units. The grating structure includes a base layer disposed on the filter units, and the grating portions are disposed on the base layer.

In some embodiments, the image sensor further includes microlenses aligned to the filter units. The base layer is disposed on the microlenses.

In some embodiments, the filter units include a first filter unit, and the grating groups include a first grating group disposed on the first filter unit, wherein the first filter unit and the first grating group include the same materials.

In some embodiments, the filter units include a second filter unit, and the grating groups further include a second grating group disposed on the second filter unit, wherein the second filter unit and the second grating group include the same materials.

In some embodiments, the materials of the second filter unit and the second grating group are different from the materials of the first filter unit and the first grating group.

In conclusion, with the grating structure of the image sensor, the phenomenon wherein a flare appears on the image generated by the image sensor is decreased, and the optical cross talk of the image sensor is minimized. Therefore, the image quality of the image sensor is improved.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
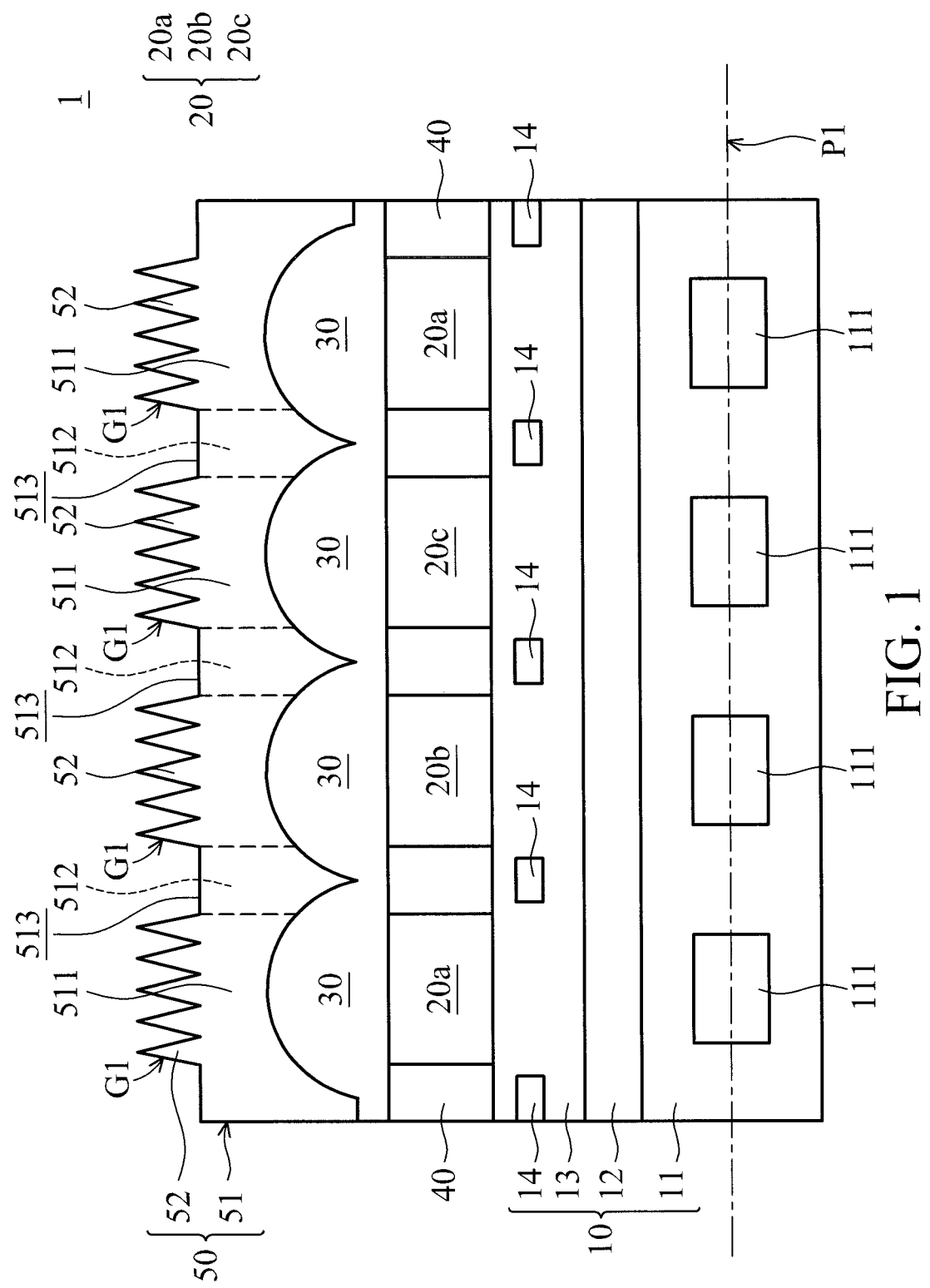
FIG. 1 is a schematic view of an image sensor in accordance with some embodiments of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale, or the drawings may be otherwise simplified for clarity of discussion, as they are intended merely for illustration.

Figure 2:
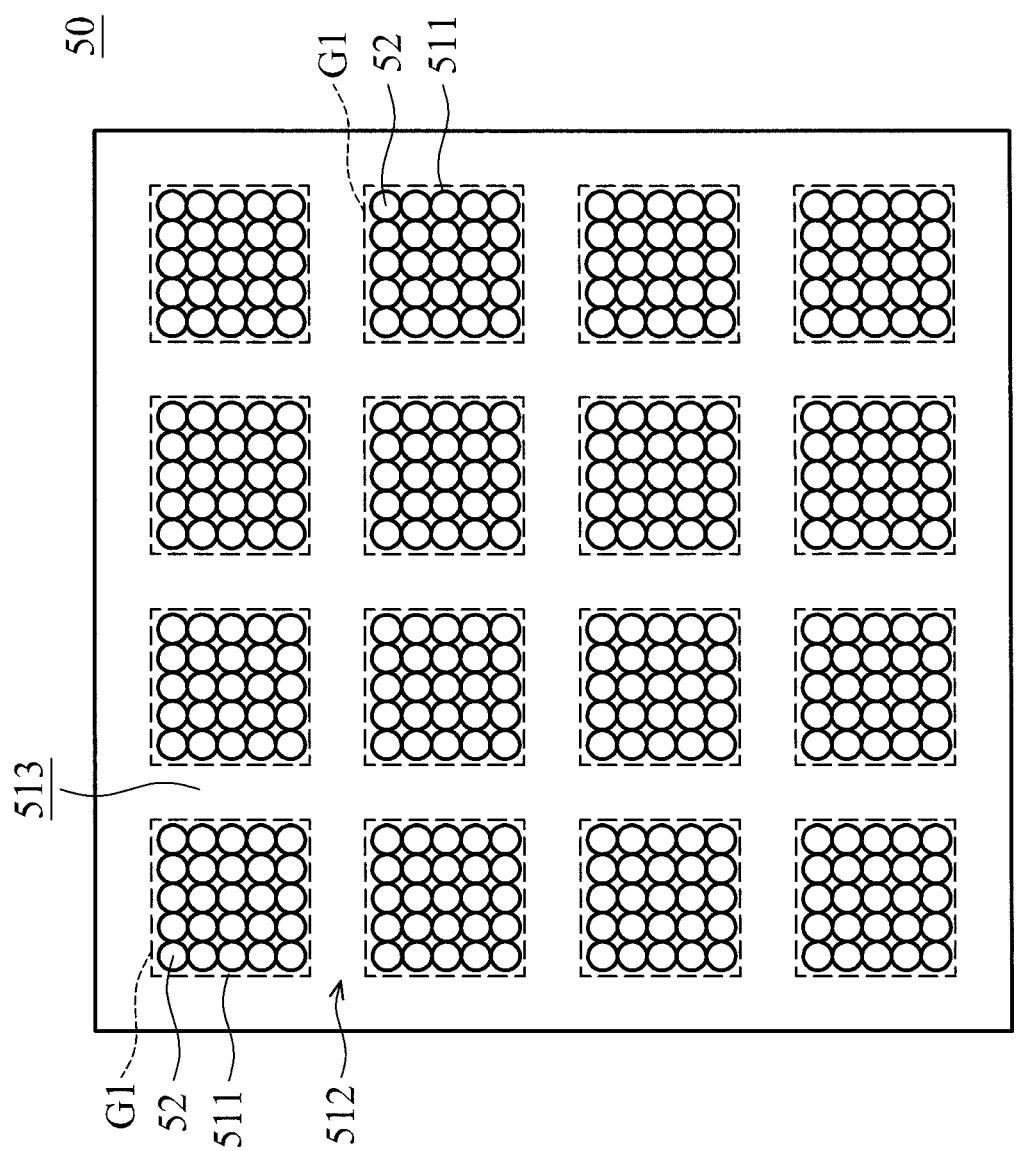
FIG. 2 is a top view of a grating structure in accordance with some embodiments of the present disclosure.

FIG. 1 is a schematic view of an image sensor 1 in accordance with some embodiments of the present disclosure. FIG. 2 is a top view of a grating structure 50 in accordance with some embodiments of the present disclosure. The image sensor 1 is configured to capture an image. The image sensor 1 can be applied to an imaging apparatus, such as a digital camera. In some embodiments, the image sensor 1 is a CMOS (Complementary Metal-Oxide-Semiconductor) sensor. In some embodiments, the image sensor 1 is a FSI (Frontside illumination) or BSI (backside illumination) CMOS sensor, or another suitable sensor.

The image sensor 1 includes a sensing layer 10, filter units 20, microlenses 30, a grid structure 40, and a grating structure 50. The sensing layer 10 extends along a reference plane P1. The sensing layer 10 is configured to detect incident light and generate an image signal according to the light falling on the sensing layer 10.

The sensing layer 10 may include all of the following elements, but the sensing layer 10 does not necessarily include all of the following elements, as long as the object of the sensing layer 10 is achieved. The sensing layer 10 includes a substrate 11, an anti-reflection layer 12, a dielectric layer 13, and a shielding element 14. In some embodiments, the sensing layer 10 further includes other optional layers (not shown in figures).

The sensing layer 10 further includes sensing units 111 disposed in the substrate 11. The sensing units 111 are arranged in a sensing array on the reference plane P1. In some embodiments, the sensing units 111 are photodiodes.

Each of the sensing units 111 is configured to sense light and generate an intensity signal according to the intensity of the light falling thereon. The image signal is formed by the intensity signals.

The anti-reflection layer 12 is disposed on the substrate 11, and extends parallel to the reference plane P1. The anti-reflection layer 12 is configured to decrease the reflection of the light being transmitted to the sensing units 111. In some embodiments, the anti-reflection layer 12 is parallel to the sensing layer 10. The anti-reflection layer 12 is a high-k film.

The dielectric layer 13 is disposed on the anti-reflection layer 12, and extends parallel to the reference plane P1. In some embodiments, the dielectric layer 13 is a low-k dielectric layer 13. The shielding element 14 is embedded in the dielectric layer 13. The shielding element 14 is configured to block light for decreasing the crosstalk effect of the image sensor 1.

The filter units 20 are disposed on the dielectric layer 13 of the sensing layer 10. The filter units 20 are arranged in a filter array on a plane parallel to the reference plane P1. Each of the filter units 20 is disposed over one of the sensing units 111.

Each of the filter units 20 allows a predetermined range of wavelengths of light to pass through. In some embodiments, the filter units 20 are color filter units. The filter units 20 include red filter units 20a, green filter units 20b, and blue filter units 20c. The red filter units 20a, the green filter units 20b, and the blue filter units 20c are alternately arranged in the filter array.

The red filter unit 20a allows wavelengths of light in a range from 620 nm to 750 nm (red light) to pass to the sensing unit 111. The green filter unit 20b allows wavelengths of light in a range from 495 nm to 570 nm (green light) to pass to the sensing unit 111. The blue filter unit 20c allows wavelengths of light in a range from 425 nm to 495 nm (blue light) to pass to the sensing unit 111.

The microlenses 30 are aligned to the filter units 20. Each of the microlenses 30 is disposed on or over one of the filter units 20. The microlenses 30 are arranged in a microlens array on a plane parallel to the reference plane P1. The microlenses 30 are configured to focus light to the sensing units 111.

The grid structure 40 is connected to and around each of the filter units 20. Moreover, the grid structure 40 is disposed on the sensing layer 10, and is parallel to the reference plane P1. The grid structure 40 is configured to reflect the light in the filter units 20 toward the sensing units 111.

In some embodiments, the refractive index of the grid structure 40 is lower than the refractive index of the filter units 20, and thus the filter units 20 and the grid structure 40 form a light pipe structure to guide light to the sensing units 111. In some embodiments, the refractive index of the grid structure 40 is in a range from about 1.2 to about 1.5. The refractive index of the filter unit 20 is in a range from about 1.7 to about 3.2.

The grating structure 50 is disposed on the filter units 20. The grating structure 50 extends substantially parallel to the reference plane P1. In this embodiment, the grating structure 50 is disposed on the microlenses 30. The grating structure 50 is transparent. The grating structure 50 is configured to provide an anti-reflection function and reduce the flare phenomenon, wherein flares appear on images generated by the image sensor 1.

In some embodiments, the grating structure 50 provides anti-reflection function. For greater performance of the anti-reflection function, the refractive index of the grating structure 50 is between the refractive index of air and the refractive index of microlens 30. The grating structure 50 is made from inorganic materials, such as $SiO_2$. Therefore, the grating structure 50 provides a waterproof function for the sensing layer 10 of the image sensor 1.

The grating structure 50 includes a base layer 51 and grating portions 52. The base layer 51 disposed on the filter units 20. In this embodiment, the base layer 51 is disposed on the microlenses 30.

The grating portions 52 are disposed on the base layer 51 and located over the filter units 20. In some embodiments, the grating portions 52 are arranged along a plane that is parallel to the sensing layer 10 or the reference plane P1. The grating portions 52 are configured to decrease the incidents of flares appearing on images generated by the image sensor 1.

As shown in FIGS. 1 and 2, in some embodiments, the base layer 51 includes grating areas 511 and a grid area 512. The grating areas 511 are located over the filter units 20. The grid area 512 is surrounding each of the grating areas 511 and located over the grid structure 40. The grating portions 52 are located on the grating area 511. In some embodiments, the grating portions 52 are not located on the grid area 512.

Since the grating portions 52 are not disposed on the grid area 512, the grid area 512 has a flat top surface 513, and thus a portion of the light can reflected by the grid area 512. Therefore, the light entering to the grid structure 40 or the filter units 20 via the grid area 512 is decreased. The optical cross talk of the image sensor 1 is minimized, and thus the image quality of the image sensor 1 is improved.

As shown in FIGS. 1 and 2, in some embodiments, the grating portions 52 form a number of grating groups G1 separated from each other. Each of the grating groups G1 is aligned to one of the filter units 20. Each of the grating groups G1 is located on or over one of the grating areas 511 and the filter units 20. Furthermore, each of the plurality of the grating group G1 is surrounded by the flat top surface 513 of the grid area 512. The flat top surface 513 of the grid area 512 is aligned to the grid structure 40. In other words, some of the grating portions 52 located over one of the grating areas 511 form one grating group G1. The grating portions 52 are arranged in a grating array in the grating group G1.

In some embodiments, the grating portions 52 are arranged in an N×N matrix, and the N is a positive integer greater than 4. In this embodiment, the grating portions 52 are arranged in a 5×5 matrix as shown in FIGS. 1 and 2. In some embodiments the grating portions 52 are arranged in a 6×6 matrix, 7×7 matrix, 8×8 matrix, or 9×9 matrix. In some embodiments, the number of the grating portions 52 in one grating group G1 is in a range from about 25 to 225. In some embodiments, each of the grating groups G1 includes at least 25 grating portions.

Moreover, in some embodiments, the numbers of the grating portions 52 in different grating groups G1 are the same. In some embodiments, the numbers of the grating portions 52 in different grating groups G1 are different.

Figure 4:
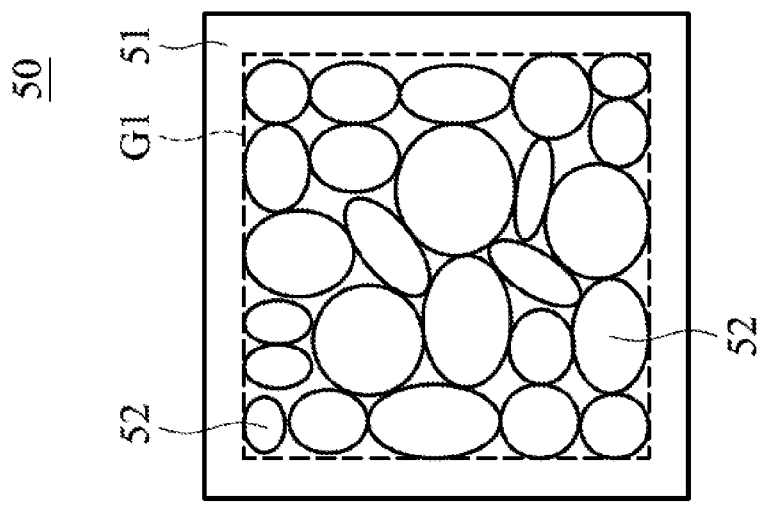
FIG. 4 is a portion of a top view of the grating structure in accordance with some embodiments of the present disclosure.
Figure 3:
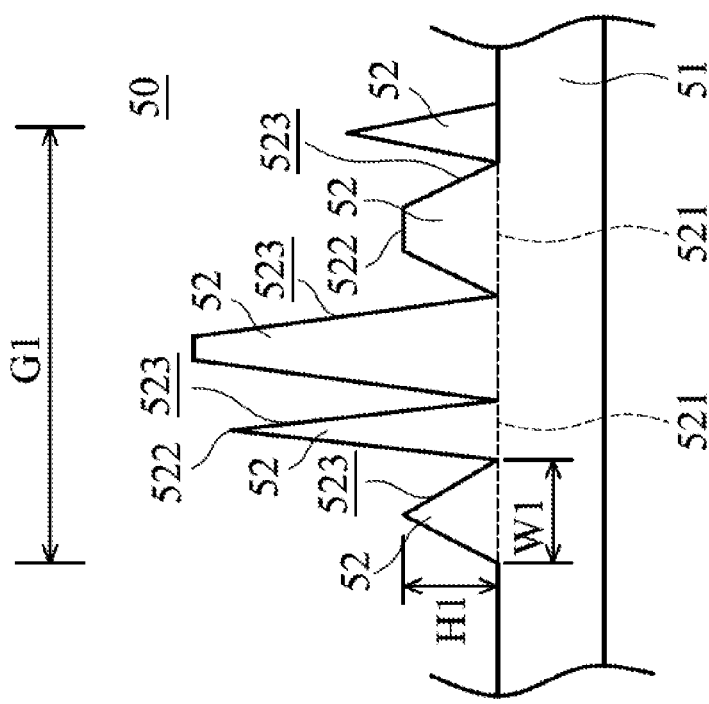
FIG. 3 is a cross-sectional view of the grating structure in accordance with some embodiments of the present disclosure.

FIG. 3 is a cross-sectional view of the grating structure 50 in accordance with some embodiments of the present disclosure. FIG. 4 is a portion of a top view of the grating structure 50 in accordance with some embodiments of the present disclosure. In this embodiments, the grating portions 52 in one grating group G1 are arranged in random.

The grating portions 52 are angular pyramids, truncated pyramids, cones or truncated cones. In some embodiments, the shapes of the grating portions 52 in one grating group G1 are the same or substantially the same (as shown in FIGS. 1 and 2). In some embodiments, some or all the shapes of the grating portions 52 in one grating group G1 are different (as shown in FIGS. 3 and 4).

The grating portion 52 has a height H1 relative to the grid area 512, and various widths W1. The various widths W1 are measured in a direction parallel to the base layer 51. The aspect ratio (width:height) of each of the grating portions 52 is in a range from about 1:4 to 1:20. In some embodiments, the aspect ratios of the grating portions 52 are greater than 1:4, and the aspect ratios of the grating portions 52 are less than 1:20. In some embodiments, some or all the aspect ratios of the grating portions 52 in one grating group G1 are different. In some embodiments, the aspect ratios of the grating portions 52 in one grating group G1 are the same or sustainably the same.

In some embodiments, the heights H1 of the grating portions 52 in one grating group G1 are the same or sustainably the same (as shown in FIG. 1). In some embodiments, the heights H1 of some or all the grating portions 52 in one grating group G1 are different (as shown in FIG. 3).

The grating portion 52 includes a bottom surface 521 and a top surface 522. The bottom surface 521 is close to the filter unit 20 (as shown in FIG. 1), and connected to the base layer 51. The top surface 522 is far from the base layer 51 (or the filter units 20). The various widths W1 gradually decreased from the bottom surface 521 to the top surface 522.

In some embodiments, the top surfaces 522 include flat planes or points. In some embodiments, the widths W1 of the bottom surfaces 521 in one grating group G1 are the same or sustainably the same (as shown in FIG. 1). In some embodiments, the widths W1 of some or all the bottom surfaces 521 in one grating group G1 are different (as shown in FIG. 4).

In some embodiments, the bottom surfaces 521 are circles or ellipses (as shown in FIG. 4). In some embodiments, the bottom surfaces 521 are polygons, rectangles or squares. In some embodiments, the shapes of the bottom surfaces 521 in one grating group G1 are the same or sustainably the same (as shown in FIG. 2). In some embodiments, the shapes of some or all the bottom surfaces 521 in one grating group G1 are different (as shown in FIG. 4).

In addition, in some embodiments, the areas of the bottom surfaces 521 in one grating group G1 are the same or sustainably the same (as shown in FIG. 2). In some embodiments, the areas of some or all the bottom surfaces 521 in one grating group G1 are different (as shown in FIG. 4).

The grating portion 52 further includes an inclined surface 523. The inclined surface 523 is inclined relative to the base layer 51. In some embodiments, the slopes of the grating portions 52 in one grating group G1 are the same or sustainably the same (as shown in FIG. 1). In some embodiments, the slopes of some or all the grating portions 52 in one grating group G1 are different (as shown in FIG. 3).

Figure 5:
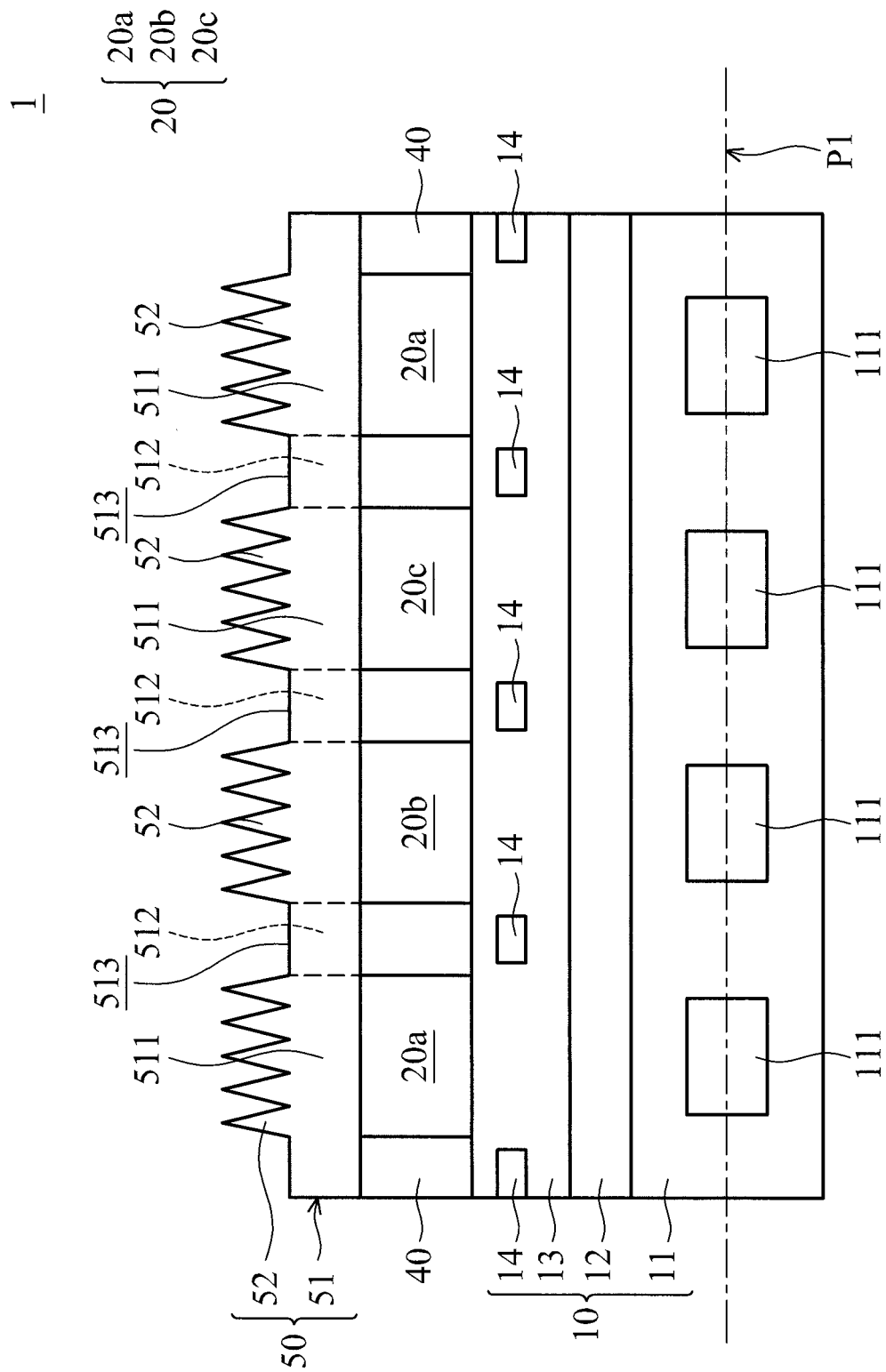
FIG. 5 is a schematic view of an image sensor in accordance with some embodiments of the present disclosure.

FIG. 5 is a schematic view of an image sensor 1 in accordance with some embodiments of the present disclosure. In some embodiments, there are no microlenses 30 located between the filter units 20 and the grating structure 50. In some embodiments, there are no microlenses 30 in the image sensor 1. The base layer 51 contacts with the filter units 20 and the grid structure 40.

Since the grating portions 52 are not disposed on the grid area 512, the grid area 512 has a flat top surface, and thus a portion of the light can be reflected by the grid area 512. The light entering to the grid structure 40 or the filter units 20 via the grid area 512 is decreased. Moreover, the grating structure 50 can be used to gather light to the filter units 20. Therefore, the microlenses 30 can be omitted. Since the microlenses 30 are omitted, the manufacturing cost of the image sensor 1 is decreased.

Figure 6:
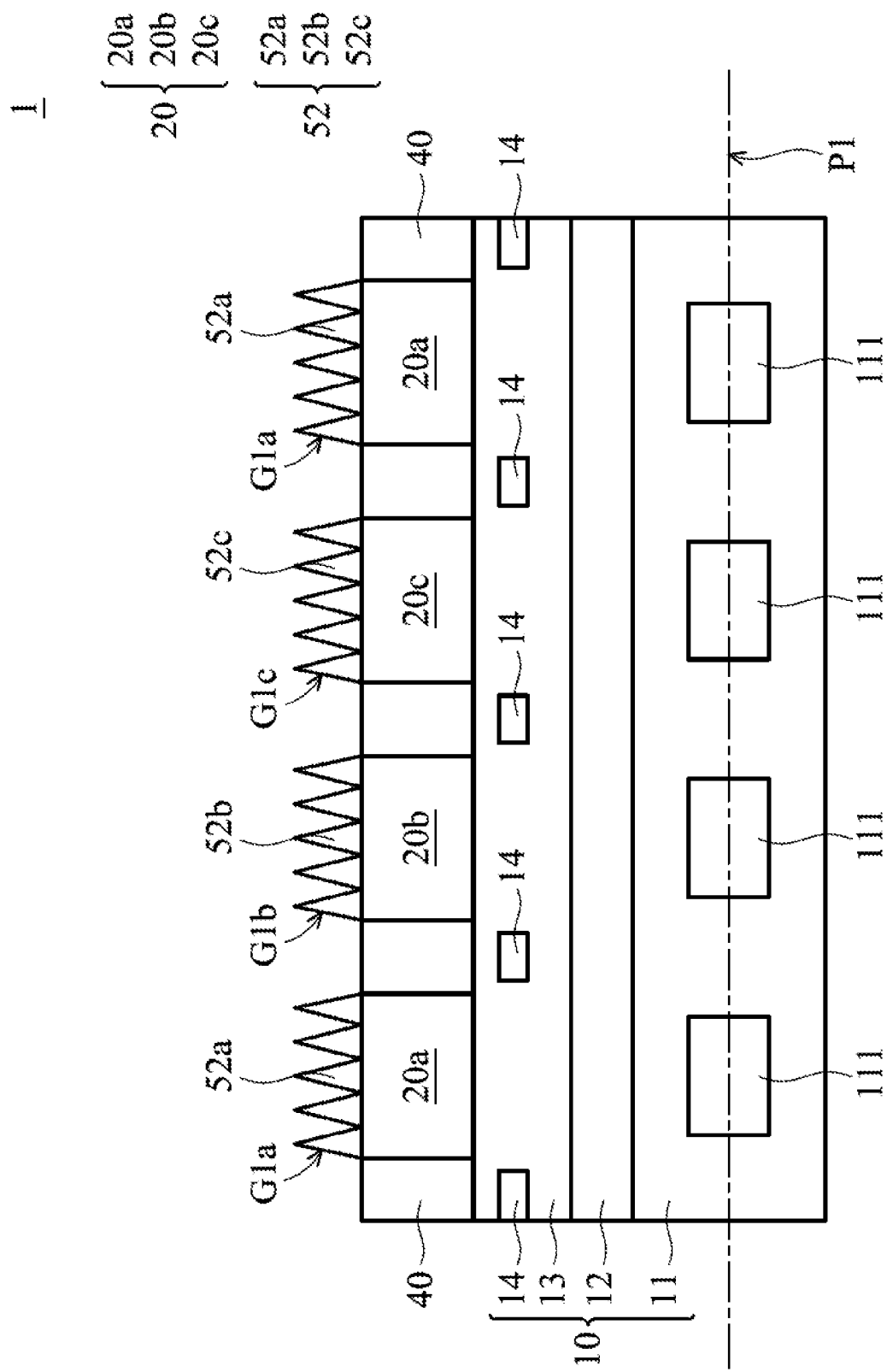
FIG. 6 is a schematic view of an image sensor in accordance with some embodiments of the present disclosure.

FIG. 6 is a schematic view of an image sensor 1 in accordance with some embodiments of the present disclosure. In some embodiments, there are no microlenses 30 located between the filter units 20 and the grating structure 50. The grating structure 50 does not include the base layer 51, which is connected to each grating portion 52.

The grating portions 52 include grating portions 52a, grating portions 52b, and grating portions 52c. The grating portions 52a forms a number of grating groups G1a. The grating portions 52b forms a number of grating groups G1b. The grating portions 52c forms a number of grating groups G1c. The grating portions 52a are disposed on or are in direct contact with the filter units 20a. The grating portions 52b are disposed on or are in direct contact with the filter units 20b. The grating portions 52c are disposed on or are in direct contact with the filter units 20c.

In some embodiments, there are no grating portions 52 disposed on the grid structure 40. The grating portions 52a, 52b, and 52c are placed a distance from each other. The filter unit 20a and the grating portions 52a include the same materials, and are formed as a single piece. The filter unit 20b and the grating portions 52b include the same materials, and are formed as a single piece. The filter unit 20c and the grating portions 52c include the same materials, and are formed as a single piece.

In addition, in some embodiments, the materials of the filter unit 20a and the grating portions 52a are different from the materials of the filter unit 20b and the grating portions 52b, and different from the materials of the filter unit 20c and the grating portions 52c. The materials of the filter unit 20b and the grating portions 52b are different from the materials of the filter unit 20c and the grating portions 52c.

In conclusion, with the grating structure of the image sensor, the phenomenon of a flare appearing on the image generated by the image sensor is decreased, and the optical cross talk of the image sensor is minimized. Therefore, the image quality of the image sensor is improved.

The disclosed features may be combined, modified, or replaced in any suitable manner in one or more disclosed embodiments, but are not limited to any particular embodiments.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
a sensing layer;
a plurality of filter units disposed on the sensing layer;
a grating structure, disposed on the plurality of filter units, comprising a plurality of grating portions, and
a grid structure, disposed on the sensing layer, surrounding each of the plurality of filter units,
wherein the plurality of grating portions form a plurality of grating groups, and each of the plurality of grating groups is separated from each other, and
wherein each of the plurality of grating groups is surrounded by a flat top surface, and the flat top surface is aligned to the grid structure.

2. The image sensor as claimed in claim 1, wherein each of the plurality of grating groups comprises at least 25 grating portions.

3. The image sensor as claimed in claim 1, wherein each of the plurality of grating groups is aligned to one of the plurality of filter units.

4. The image sensor as claimed in claim 3, wherein the grating structure comprises a base layer, and the plurality of grating portions are disposed on the base layer.

5. The image sensor as claimed in claim 4, further comprising a plurality of microlenses aligned to the plurality of filter units, and the base layer is disposed on the plurality of microlenses.

6. The image sensor as claimed in claim 1, wherein the plurality of filter units comprise a first filter unit, and the plurality of grating groups comprise a first grating group disposed on the first filter unit, wherein the first filter unit and the first grating group comprise the same materials.

7. The image sensor as claimed in claim 6, wherein the plurality of filter units comprise a second filter unit, and the plurality of grating groups further comprise a second grating group disposed on the second filter unit, wherein the second filter unit and the second grating group comprise the same materials.

8. The image sensor as claimed in claim 7, wherein the materials of the second filter unit and the second grating group are different from the materials of the first filter unit and the first grating group.

9. The image sensor as claimed in claim 1, wherein the plurality of grating portions are angular pyramids, truncated pyramids, cones or truncated cones.

10. The image sensor as claimed in claim 1, wherein each of the plurality of grating portions comprises a bottom surface close to the plurality of filter units, a top surface far from the plurality of filter units, and various widths gradually decreased from the bottom surface to the top surface.

11. The image sensor as claimed in claim 10, wherein the top surfaces are flat planes or points.

12. The image sensor as claimed in claim 10, wherein the bottom surfaces are circles, ellipses, polygons, rectangles or squares.

13. The image sensor as claimed in claim 1, wherein aspect ratios of the plurality of grating portions are greater than 1:4.

14. The image sensor as claimed in claim 1, wherein aspect ratios of the plurality of grating portions are less than 1:20.

15. The image sensor as claimed in claim 1, wherein some of aspect ratios of the plurality of grating portions in one of the plurality of grating groups are different.

16. The image sensor as claimed in claim 1, wherein the grating structure comprises inorganic materials.

17. The image sensor as claimed in claim 1, further comprising a plurality of microlenses aligned to the plurality of filter units, wherein the grating structure is disposed on the plurality of microlenses.

* * * * *